United States Patent [19]

van de Plassche

[11] Patent Number: 4,573,005
[45] Date of Patent: Feb. 25, 1986

[54] CURRENT SOURCE ARRANGEMENT HAVING A PRECISION CURRENT-MIRROR CIRCUIT

[75] Inventor: Rudy J. van de Plassche, Sunnyvale, Calif.

[73] Assignee: U.S. Philips Corporation, New York, N.Y.

[21] Appl. No.: 573,768

[22] Filed: Jan. 25, 1984

[30] Foreign Application Priority Data

Feb. 8, 1983 [NL] Netherlands .......................... 8300466

[51] Int. Cl.$^4$ .......................... G05F 3/20; H03K 13/02
[52] U.S. Cl. .............................. 323/315; 340/347 M; 340/347 CC
[58] Field of Search ................ 323/312, 315, 317, 354, 323/268, 272; 340/347 M, 347 CC

[56] References Cited

U.S. PATENT DOCUMENTS 3,982,172  9/1976  van de Plassche .................. 323/317
4,034,366  7/1977  Memishian, Jr. .............. 340/347 M
4,125,803  11/1978  van de Plassche .................. 323/317
4,282,515  8/1981  Patterson, III .................. 340/347 M
4,442,399  4/1984  Nagano ................................ 323/315

OTHER PUBLICATIONS

Maio et al, "Untrimmed D/A Converter with 14-Bit Resolution", IEEE J. Solid State Circuits, vol. SC-16, No. 6, Dec. '81, pp. 616-620.

Primary Examiner—Peter S. Wong
Assistant Examiner—D. L. Rebsch
Attorney, Agent, or Firm—Thomas A. Briody; William J. Streeter; Edward W. Goodman

[57] ABSTRACT

In a digital-to-analog converter (1) a plurality of binary weighted currents are generated, which currents must be in an accurate current ratio relative to each other. By means of a coupling network (15) which is controlled by a control circuit (17), a plurality of currents from said digital-to-analog converter (1) can be coupled to a precision current-mirror circuit (25) in accordance with a cyclic pattern, this allowing deviations in the ratios of the currents from the digital-to-analog converter (1) to be detected by detection means (80) which control correction means (18.2 to 18.16) by means of which the currents from the digital-to-analog converter (1) are corrected so as to reduce the detected deviations.

13 Claims, 5 Drawing Figures

CURRENT SOURCE ARRANGEMENT HAVING A PRECISION CURRENT-MIRROR CIRCUIT

BACKGROUND OF THE INVENTION

The invention relates to a current-source arrangement comprising:

means for generating a plurality of currents which, at least pairwise, are in a ratio which is substantially equal to a given current ratio, means for detecting deviations in the values of at least some of the currents from those required to realize the given current ratio, and means for correcting said currents so as to reduce the detected deviations.

In various fields of electronics there is a need for circuits which are capable of supplying currents whose values bear a very accurate ratio to each other. Such circuits are required in, for example, measuring equipment, where various current ratios must be available for measuring-range selection, and digital-to-analog converters which form an analog signal by adding a plurality of currents to each other in accordance with a digital code.

It is known to generate binary weighted currents in a digital-to-analog converter by applying a reference voltage across resistors of binary weighted resistance values or across a so-called resistive ladder network. The accuracy of this type of digital-to-analog converter mainly depends on the accuracy of the resistance ratios. In order to obtain these accurate ratios the resistors are trimmed, for example, by means of a laser. However, in practice, resistor trimming is a time-consuming and expensive operation.

Another known method of generating currents with accurate current ratios employs the dynamic element matching principle. This principle is known from U.S. Pat. No. 3,982,172 and U.S. Pat. No. 4,125,803. These employ a current-source arrangement which supplies a plurality of currents which have substantially equal current values due only to the limited accuracy of the integration process. By means of a permutation circuit, these currents are transferred to outputs of the permutation circuit in accordance with a cyclic permutation. The currents on the outputs each comprise a direct current of a value equal to the average value of the currents from the current-source arrangement and a ripple which is superimposed on the direct current, which ripple is formed by the differences between the currents from the current source arrangement. The ripple can be removed by arranging a filter capacitor on each output of the permutation circuit. However, because of their large values, such filter capacitors cannot be integrated but must be added externally to the integrated circuit. This requires additional connection pins, which entails additional costs. For example, for a 16-bit digital-to-analog converter using such a current-source arrangement 16, additional connection pins are required.

This means that there is a need for methods which enable currents with accurate mutual current ratios to be generated in a simple manner.

A current-source arrangement of a type as set forth in the opening paragraph is known from the article "An Untrimmed D/A Converter with 14 Bit Resolution" IEEE Jnl. of Solid-State Circuits, Vol. SC-16, No. 6, December 1981, pages 616–620. This digital-to-analog converter comprises a ladder network with untrimmed resistors. Deviations in the values of the currents are detected by comparing the output voltages of the digital-to-analog converter which correspond to said currents with a very accurate sawtooth voltage. The information about said deviations is stored in a memory. Subsequently the information is employed for driving a sub-digital-to-analog converter by means of which the deviations in the currents of the digital-to-analog converter are eliminated.

Such a circuit arrangement does not require resistor trimming, but it does require a sawtooth voltage of very high linearity over a wide range, which is difficult to achieve.

SUMMARY OF THE INVENTION

Therefore, it is the object of the invention to provide a current-source arrangement by means of which a plurality of currents having mutually accurate current ratios can be generated in a simple manner. A current source arrangement of the type set forth in the opening paragraph is characterized in that the means for detecting deviations in the values of the currents comprises a precision current-mirror circuit having an input and at least one output on which a current appears which is in an accurate ratio to a current on the input, a coupling network for cyclically coupling at least some of the currents from the means for generating a plurality of currents, at least pairwise to the input and to at least one output of the precision current mirror circuit, and a detection circuit on each output of the precision current-mirror circuit for detecting the difference between the current from the means for generating a plurality of currents coupled to said output and the current from the current-mirror circuit which appears on said output.

The invention is based on recognition of the fact that it is possible to detect deviations in the current ratios by coupling said currents to a current mirror which operates very accurately. The number of outputs of the current mirror is limited and is at least one. Each time, some of the currents from the means for generating a plurality of currents are coupled to the current mirror by means of a coupling network, one current being coupled to the input and the other currents each being coupled to an output. The ratio of the currents coupled to the outputs to the current coupled to the input is only substantially equal to a given value. However, the reflected currents also appear on the outputs of the current mirror, the ratio of these currents to the current on the input being equal to said given value with a very high accuracy. The difference between an inaccurate current from the means for generating a plurality of currents and a reflected accurate current on an output of the current mirror is detected by a detection circuit. This detection circuit controls a correction circuit which corrects the relevant current from the means for generating a plurality of currents, so that the ratio of this current to the current on the input is accurately equal to the current-mirror ratio for this output of the current mirror. After correction of the currents, a subsequent number of currents is coupled to the outputs of the current mirror by means of the coupling network, one of the corrected currents of the preceding number being coupled to the input of the current mirror. In this way, the current mirror circuit processes all, or at least some, of the currents from the means for generating a plurality of currents by means of the coupling network, after which the cycle is repeated. In this way, it is possible to obtain a large number of currents with accurate mutual ratios by means of a current mirror having a small number of outputs.

An embodiment of the invention is characterized in that the precision current-mirror circuit comprises:

a current distribution circuit provided with a plurality of transistors having parallel-connected main current paths and having commoned control electrodes which are driven by an amplifier whose input is coupled to the input of the current-mirror circuit, and a permutation circuit for transferring the currents from the current distribution circuit to the input and the at least one output of the current-mirror circuit in accordance with a cyclic permutation.

A precision current mirror circuit can be arranged in an advantageous manner by the use of the dynamic element matching principle, which is known per se from the aforementioned U.S. Pat. Nos. 3,982,172 and 4,125,803. The currents on the outputs of the current-mirror circuit then have very accurate direct current ratios. The ripple superimposed on these direct currents can be filtered out by arranging filter capacitors on the input and the output(s) of the current-mirror circuit. Since the number of outputs of the current-mirror circuit is small, only a limited number of external connection pins for said filter capacitors are required on the integrated circuit. As a result of the small number of outputs, the permutation circuit can also operate at a low frequency, which assists in obtaining a high accuracy.

The arrangement may be further characterized in that the or each detection circuit comprises a first current-voltage converter. Suitably such an arrangement is characterized in that each first current-voltage converter comprises an amplifier having a first input which is coupled to the corresponding output of the current-mirror circuit, a second input which carries a reference voltage, and an output which is coupled to the first input of the amplifier via a feedback capacitor. The amplifier then functions as an integrator. The copacitor has a small value so that it can be integrated.

The arrangement may be further characterized in that the means for correcting the currents comprise a second current-voltage converter corresponding to each current to be corrected, which second current-voltage converter comprises an amplifier having an output which is coupled to a first input of the amplifier via a feedback capacitor, which first input can be coupled to the output of the first current-voltage converter by means of a switching capacitor. The switching capacitor transfers the charge on the capacitor of the first current-voltage converter to the capacitor of the second current-voltage converter. The capacitor of the second current-voltage converter, by means of which converter the relevant current is corrected, holds the correction voltage at least until the corresponding interval of the next cycle of the coupling network.

The output of the amplifier of the first current-voltage converter may be coupled to a first input of a comparator, which has a second input which carries a reference voltage. The comparator converts the output signal of the amplifier into a logic signal.

The means for correcting currents may comprise a counting circuit corresponding to each current to be corrected, which counting circuit can be coupled to the output of the first current-voltage converter by means of a switch and generates a plurality of logic signals in dependence upon the logic signal on the output of the comparator, which signals, by means of a digital-analog converter, are converted into an analog output signal with which the relevant current is corrected. The count of the counting circuit does not change until the corresponding interval of the next cycle of the coupling network, so that during this period, the digital-to-analog converter holds the correction signal.

The invention is particularly suitable for use in current source arrangements in which the means for generating a plurality of currents comprise means for generating at least a plurality of currents whose values vary in conformity with a binary weighted series, as required in digital-analog converters. One precision current-mirror current can now correct the currents from one or more, for example 16-bit, digital-to-analog converters. In addition, the invention may be used in current-source arrangements in which the means for generating a plurality of currents comprise means for generating a plurality of currents of substantially equal current values, as is frequently required in modern integrated circuits. An embodiment in which the means for generating a plurality of currents is provided with a plurality of parallel branches which each comprise the main current path of a respective first transistor, which main current path extends between respective first and second main terminals, each branch comprising a resistor which is coupled to the first main terminal of the relevant first transistor, may be characterized in that the at least one output and the input of the precision current-mirror circuit are coupled to said second main terminals or to those ends of the resistors which are remote from the first transistors by means of the coupling network. Herein, the first main terminal of a transistor is to be understood to mean the emitter or source electrode and the second main terminal of a transistor is to be understood to mean the collector or drain electrode of a bipolar and of a unipolar transistor, respectively. Such an arrangement may be further characterized in that in at least some of the branches at those ends of the resistors which are remote from the first transistors, the main current path of a field-effect transistor is arranged, which path extends between respective first and second main terminals. The at least one output and the input of the precision current-mirror circuit may be coupled to the second main terminals of the field-effect transistors by means of the coupling network. The field-effect transistors have the advantage that undesired switching transients caused by switching of the coupling network have substantially no influence on the currents from the current-source arrangement. In this arrangement, it is advantageous to couple the outputs of the correction means to the gate electrodes of the field-effect transistors. The correction means increases or decreases the voltage on the gate electrodes of the FETs and thus the voltage difference between these electrodes and the commoned control electrodes of the first transistors, so that the main currents of these transistors are corrected.

DESCRIPTION OF THE DRAWINGS

The invention will now be described in more detail, by way of example, with reference to the accompanying drawings in which.

DESCRIPTION OF THE PREFERRED EMBODIMENTS

Figure 1:
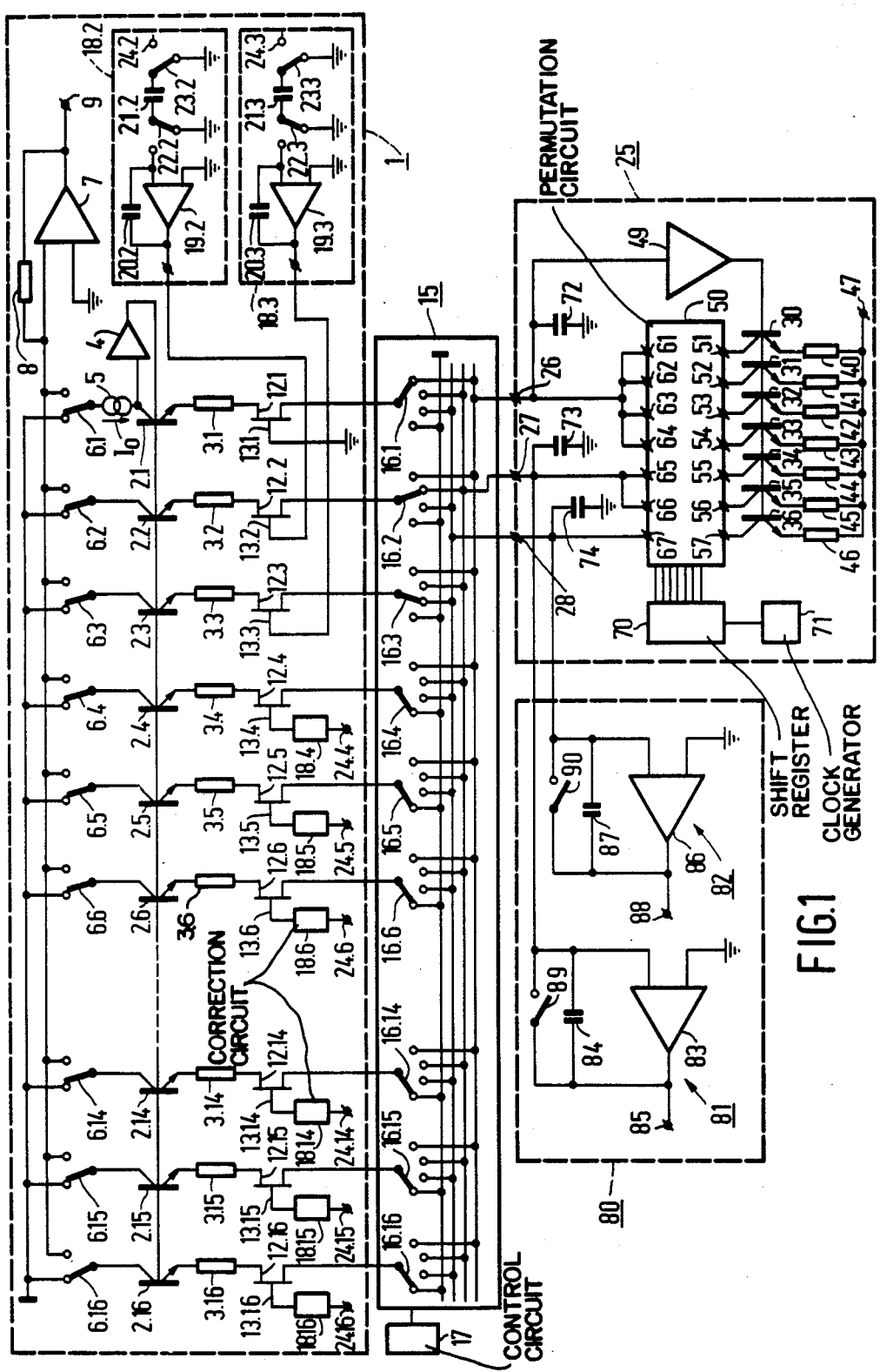
FIG. 1 shows a first embodiment of the invention in the form of a digital-analog converter.

FIG. 1 schematically shows a first embodiment of the invention in the form of a digital-analog converter. In general it comprises the actual digital-analog converter 1 in which a plurality of binary weighted currents which should have accurate mutual current ratios are generated and a coupling network 15 with which a plurality of currents from the D/A converter 1 can be coupled to a precision current-mirror circuit 25 in accordance with a cyclic pattern, by means of which current-mirror circuit 25 deviations in the ratios of the currents from the D/A converter 1 can be detected with detection means 80 which controls correction means 18.2 to 18.16 by means of which the relevant currents from the D/A converter 1 can be corrected so as to reduce the deviations.

In the present embodiment, the digital-analog converter 1 is a 16-bit D/A converter comprising 16 transistors 2.1 to 2.16. For D/A converters having not more than approximately 10 bits, it is possible to obtain equal current densities in the transistors by the binary scaling of all emitter areas. In the present 16-bit D/A converter, equal current densities are obtained by arranging the transistors 2.1 to 2.16 in two identical sections of 8 transistors each, the emitter area of a transistor in each section being half the emitter area of the preceding transistor and the sections being adapted to each other by a voltage source, not shown, which is arranged in the base line between the sections. Untrimmed resistors 3.1 to 3.16 are arranged in the emitter lines of the transistors 2.1 to 2.16, the resistance value of each resistor being substantially twice as high as that of the preceding resistor. The transistors 2.1 to 2.16 have commoned bases which are coupled to the output of an operational amplifier 4 whose input is coupled to a current source 5 whose current has a value Io. The amplifier 4 drives these bases so that the collector current of transistor 2.1, which is employed as a reference current, is accurately equal to the current Io from the current source 5. From this collector current of the reference transistor 2.1, the collector current of each of the transistors 2.2 to 2.16 is substantially half the value of the collector current of the preceding transistor if inaccuracies in the resistors and transistors are ignored, because the emitter voltages of all the transistors are substantially equal. The currents from transistors 2.1 to 2.16 then have the values Io, Io/2, Io/4, ... Io/2$^{15}$. The collector currents of the transistors 2.1 to 2.16 can be fed to ground or to the input of an amplifier 7 by switches 6.1 to 6.16 which are controlled by the digital input code. The analog output signal corresponding to the digital code appears on the output 9, which is coupled to the (inverting) input via a feedback resistor 8. The resistors 3.1 to 3.16 are connected to the source electrodes of n-channel field-effect transistors 12.1 to 12.16, whose channel length-width ratio, as the case may be per section, is scaled in conformity with the relevant current value in order to maintain equal current densities and thereby equal voltages between the gate and source electrodes of the transistors. In the normal condition, the drain electrodes are coupled to a point of fixed voltage via switches 16.1 to 16.16 which form part of the coupling network 15, which point of fixed voltage is at 0 V in the present embodiment. The gate electrode 13.1 of transistor 12.1 is connected directly to a point of fixed voltage, in the present example a voltage of zero, while the gate electrodes 13.2 to 13.16 are connected to said point by means of correction circuits 18.2 to 18.16. For the sake of clarity, only the correction circuits 18.2 and 18.3 are shown in detail, the other correction circuits being shown only schematically. The correction circuit 18.2 comprises an amplifier 19.2, whose output is coupled to the gate electrode 13.2 and via a capacitor 20.2 to the inverting input thereof. The non-inverting input of the amplifier 19.2 is connected to ground. A capacitor 21.2 may be short-circuited to ground or may be connected between the inverting input of the amplifier 19.2 and input 24.2 by means of simultaneously controlled switches 22.2 and 23.2. The other correction circuits are construced in the same way.

A control circuit 17 controls the switches 16.1 to 16.16 of the coupling network 15 in such a way that the collector-emitter currents of three consecutive ones of the transistors 2.1 to 2.16 are respectively, coupled to the input 26 and the outputs 27 and 28 of the precision current-mirror circuit 25 in accordance with a cyclic pattern. The high output resistance of the drain electrode and the low input resistance of the source electrode of each of the field-effect transistors 12.1 to 12.16 ensure that during switching, the collector-emitter currents of the transistors 2.1 to 2.16 are not influenced by undesired switching transients. FIG. 1 shows the situation during the first interval of the cycle of the control circuit 17 in which the reference transistor 2.1 is coupled to the input 26 and the transistors 2.2 and 2.3 are coupled to the outputs 27 and 28 respectively, of the current-mirror circuit 25. The current-mirror circuit 25 reflects the reference current on the input 26 to the outputs 27 and 28 in accurately defined ratios. Said circuit 25 comprises parallel connected transistors 30 to 36, whose emitters are connected to a common terminal 47 via equal resistors 40 to 46, which terminal 47 carries a fixed voltage and, in the present case, is the negative power-supply terminal. The commoned bases of the transistors 30 to 36 are driven by an amplifier 49 whose input is coupled to the input 26 of the current-mirror circuit 25. The amplifier 49 controls the voltage on the commoned bases in such a way that the sum of the currents on the outputs 61, 62, 63 and 64 of a permutation circuit 50 is equal to the collector-emitter current Io of the reference transistor 2.1. The collector currents of the transistors 30 to 36 are only substantially equal to each other as a result of the limited accuracy of the integration process and in the present case, they are made substantially equal to Io/4 by splitting the current Io from the reference transistor 2.1. These currents are fed to the inputs 51 to 57 of the permutation circuit 50. This permutation circuit 50 is controlled by a circuit 70, for example a shift register, which in its turn is controlled by a clock generator 71. The operation of the permutation circuit 50 is described comprehensively in the afore-mentioned U.S. Pat. Nos. 3,982,172 and 4,125,803. In this respect it suffices to note that the permutation circuit 50 transfers each of the collector currents of the transistors 51 to 57 to each of the outputs 61 to 67 in accordance with a cyclic permutation. Thus, each of the collector currents of the transistors 30 to 36 will appear consecutively on each of the outputs 61 to 67. The direct current on each of the outputs 61 to 67 is equal to the average value Io/4 of these collector currents. These output currents exhibit a ripple around said average value Io/4, the ripple components being caused by the inequality of the collector currents. This ripple is filtered out by the filter capacitors 72, 73 and 74, which must be added externally to the circuit. Direct currents whose values relative to the direct current on the input 26 are accurately proportioned as 1:2:4 then appear on the outputs 27 and 28 of the precision-current mirror 25. For the value Io of the current from the reference transistor 2.1 on the input 26 currents whose direct current values are exactly equal to Io/2 and Io/4 will appear on the outputs 27 and 28, respectively. The currents from transistors 2.2 and 2.3 whose values are substantially equal to Io/2 and Io/4 respectively, also appear on outputs 27 and 28. Any difference in value between the inaccurate applied and accurately reflected current on the output 27 is detected by a current-voltage converter 81 and any difference in value between the applied and the reflected currents on the output 28 is detected by the current-voltage converter 82. The current-voltage converters 81 and 82 together constitute the detection means 80. The output 27 is coupled to the inverting input of an operational amplifier 83, whose non-inverting input carries a fixed voltage, in the present case 0 V. The output of the amplifier 83 is connected to the inverting input via a feedback capacitor 84.

The output 85 of the amplifier 83 is coupled to the input 24.2 of the correction circuit 18.2 by means of a switching network, which is not shown for the sake of clarity. A difference between the values of the applied inaccurate current and the accurately reflected current Io/2 on the output 27 charges the capacitor 84. The current-voltage converter 82 is constructed in the same way as the current-voltage converter 81 and comprises an amplifier 86 and a capacitor 87. The output 88 of the amplifier 86 is coupled to the input 24.3 of the correction circuit 18.3. A difference in value between the applied inaccurate current and the accurately reflected current charges the capacitor 87.

After the capacitor 84 has been charged, the capacitor 21.2 is switched between the input 24.2 of the detection circuit 18.2 and the inverting input of the amplifier 19.2 by means of the switches 22.2 and 23.2. As a result of this, the charge on capacitor 84 is transferred to capacitor 20.2, so that the latter is charged.

Similarly the capacitor 21.3 is arranged between the input 24.3 of the correction circuit 18.3 and the inverting input of the amplifier 19.3 by means of the switches 22.3 and 23.3, so that the charge on capacitor 87 is transferred to capacitor 20.3. After the capacitors 20.2 and 20.3 have been charged the capacitors 21.2 and 21.3 are short-circuited to ground by means of the respective switches 22.2, 23.2 and 22.3, 23.3. Simultaneously, reset switches 89 and 90 are closed, which switches short circuit the capacitors 84 and 87. Since the capacitors 20.2 and 20.3 are charged, the voltages on the gate electrodes 13.2 and 13.3 increase or decrease, so that the voltage differences between the bases of transistors 2.2 and 2.3 and the respective gate electrodes 13.2 and 13.3 of the transistors 12.2 and 12.3, and consequently the emitter currents of the transistors 2.2 and 2.3, increase or decrease, in such a way that these currents more accurately become equal to Io/2 and Io/4, respectively. The capacitors 20.2 and 20.3 hold the correction voltages. In the corresponding interval of the next cycle of the control circuit 17, the emitter currents of the transistors 2.2 and 2.3 are again compared with the accurately reflected currents Io/2 and Io/4 by means of the current-mirror circuit 25. Differences are again detected by the detection circuits 81 and 82 and, by means of the capacitors 21.2 and 21.3, charge is transferred to the capacitors 20.2 and 20.3. Thus, the emitter currents of the transistors 2.2 and 2.3 become more accurately equal to Io/2 and Io/4. In this way, the emitter currents of the transistors 2.2 and 2.3 are corrected in the consecutive cycles until they are equal to Io/2 and Io/4 with a high accuracy. The capacitors 20.2, 20.3 and the capacitors 21.2, 2.3 as well as the capacitors 84 and 87 have such small values that they can be integrated. In the second interval of the cycle of the control circuit 17, the switches 16.3, 16.4 and 16.5 couple the emitter currents of the transistors 2.3, 2.4 and 2.5 to the input 26 and the outputs 27 and 28, respectively, of the precision current-mirror circuit 25. The emitter current Io/4 of transistor 2.3, which has been corrected in the preceding interval, now serves as the accurate input current for the current-mirror circuit 25. The reflected accurate currents Io/8 and Io/16 appear on outputs 27 and 28. The differences from the inaccurate emitter currents of the transistors 2.4 and 2.5 are again detected by the detection circuits 81 and 82. The outputs 85 and 88 of the amplifiers 83 and 86 are now coupled to the inputs 24.4 and 24.5 of the correction circuits 18.4 and 18.5 for the transistors 12.4 and 12.5, by means of which the emitter currents of the transistors 2.4 and 2.5 are corrected so that they become equal to Io/8 and Io/16 with a higher accuracy. In the next intervals the currents of the transistors 2.6 to 2.16 are corrected in a similar way, the smallest current of the three currents corrected in the preceding interval serving each time as the accurate input current to the current mirror circuit 25. After all currents have been corrected the entire cycle is repeated.

In the present embodiment the collector-emitter currents of all transistors 2.2 to 2.16 are corrected. In principle, it is necessary to correct only those currents whose values exhibit an error which is greater than a predetermined fraction of the smallest current.

In the present embodiment, the currents are corrected by controlling the voltage on the gate electrodes of the field-effect transistors. However, it is alternatively possible to correct the currents by controlling the voltages on the individual bases of the current-source transistors.

Figure 2:
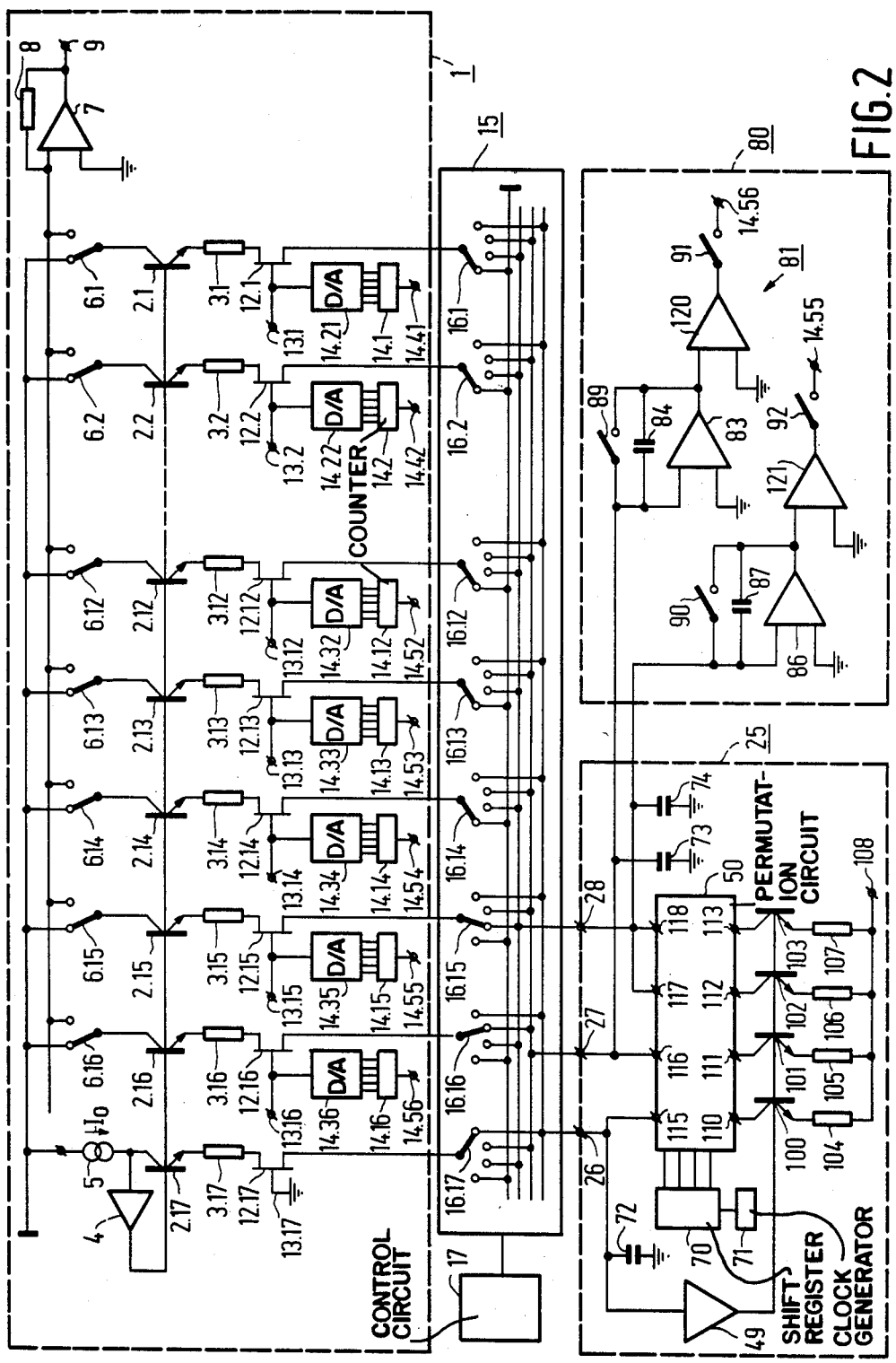
FIG. 2 shows a second embodiment of the invention in the form of a digital-analog converter.

A second embodiment of the invention in the form of a digital-analog converter will be described with reference to FIG. 2, in which identical parts bear the same reference numerals as in FIG. 1, whenever possible. The actual D/A converter 1 again comprises 16 transistors 2.1 to 2.16, with untrimmed resistors 3.1 to 3.16 having binary weighted resistance values. The reference current in the present embodiment is not equal to the largest current, i.e. to the current corresponding to the most significant bit, but to the smallest current, i.e. the current corresponding to the least significant bit. This reference current is generated by means of a transistor 2.17 having an emitter area equal to that of the transistor 2.16, in whose emitter line a resistor 3.17 is arranged, whose value is equal to that of the resistor 3.16. The base of transistor 2.17 is driven by an operational amplifier 4, whose input is coupled to the output of a current source supplying a current of the value Io. The amplifier 4 drives the bases so that the collector current of the reference transistor 2.17 is accurately equal to the current Io. The collector currents of the transistors 2.16 to 2.1 are then Io, 2 Io, 4 Io, ... $2^{15}$ Io. The switches 6.1 to 6.16, which are controlled by the digital input code, transfer the currents either to ground or to the input of the amplifier 7, on whose output the analog output signal appears. The emitter resistors 3.1 to 3.17 are connected to switches 16.1 to 16.17 of the coupling network 15 via field-effect transistors 12.1 to 12.17. The gate electrode 13.17 is connected to ground, correction circuits being coupled to the gate electrodes 13.1 to 13.16. Each correction circuit 14 comprises a counting circuit 14.1 to 14.16 having inputs 14.41 to 14.56 and having outputs coupled to the inputs of digital-to-analog converters 14.21 to 14.36, whose outputs are coupled to the gate electrodes 13.1 to 13.16. Depending on the required control range and the desired accuracy, the counting circuits 14.1 to 14.16 comprise for example six-bit counters with one sign bit which defines the sign of the voltage on the outputs of the six-bit D/A converters 14.21 to 14.36. The D/A converters 14.21 to 14.36 do not supply an output voltage when the count is zero. FIG. 2 show the situation during the first interval of the cycle of the control circuit 17 during which the reference transistor 2.17 is coupled to the input 26 and the transistors 2.16 and 2.15 are coupled to the outputs 27 and 28 of the precision current-mirror circuit 25. The control circuit 17 controls the switches 16.17 to 16.1 in such a way that two consecutive emitter currents are coupled to the outputs 27 and 28 of the current-mirror circuit 25 each time, the current on input 26 being equal to the sum of the emitter currents of the previously corrected transistors including the reference transistor. The current-mirror circuit in the present embodiment comprises parallel-connected transistors 100 to 103, whose emitters are connected to the common terminal 108 via equal resistors 104 to 107. The commoned bases are driven by an amplifier 49 whose input is coupled to the input 26 of the current mirror 25. The amplifier controls the bases so that the current on the output 115 of the permutation circuit 50 is equal to the current on the input 26. The collector currents of the transistors 100 to 103 applied to the inputs 110 to 113 are transferred to the outputs 115 to 118 by the permutation circuit 50 in accordance with a cyclic permutation. The currents from the outputs 117 and 118 are together applied to the output 28. The ratio of the current on the input 26 to the currents on the outputs 27 and 28 is then accurately equal to 1:1:2. The ripple on the input 26 and outputs 27, 28 is filtered out by externally connected filter capacitors 72, 73 and 74. In the first interval of the cycle of the control circuit, the current on input 26 is equal to Io. The reflected currents on the outputs 27 and 28 are then accurately equal to Io and 2 Io. The emitter currents of the transistors 2.16 and 2.15 are also coupled to the outputs 27 and 28, which emitter currents are substantially equal to Io and 2 Io. The differences between the accurately reflected currents and the inaccurate emitter currents on the outputs 27 and 28 are detected by the detection circuits 81 and 82. The construction of the detection circuit 81 is the same as in the first embodiment, except that the output of the amplifier 83 is coupled to the inverting input of a comparator 120, whose non-inverting input carries a fixed voltage, in the present case 0 V. Depending on whether the output voltage of the amplifier 83 is higher or lower than zero the voltage on the output of the comparator 120 is high or low, and is employed as a logic signal of the value "1" or "0". The output of the comparator 120 can be coupled to the input 14.56 of the counter 14.16 by means of a switch 91. Depending on the value of the logic signal on the output of the comparator 120, the counter 14.16 is incremented or decremented. This count is translated into six logic signals on the outputs of the counter 14.16, which signals are converted in the six-bit D/A converter 14.36 into an analog output voltage which appears on the gate electrode 13.16. In a similar way it is possible to couple the output of the comparator 121 of the detection circuit 82 to the input 14.55 of the counting circuit 14.15 by means of a switch 92, so that an analog output voltage appears on the gate electrode 13.15 of transistor 12.15. The positive or negative voltages on the gate electrodes 13.16 and 13.15 then reduce or increase the emitter currents of the transistors 2.16 and 2.15, so that these currents become more accurately equal to Io and 2 Io, respectively. The counts of the counters 14.16 and 14.15 and consequently the voltages on the gate electrodes 13.16 and 13.15 remain unchanged until the corresponding interval of the next cycle. In the consecutive cycles the emitter currents of the transistors 12.16 and 12.15 are thus corrected until they are equal to Io and 2 Io respectively, with a high degree of accuracy. In the second interval of the cycle the control circuit 17 controls the switches 16.1 to 16.17 in such a way that the emitter currents of the transistors 2.17, 2.16 and 2.15 are coupled to the input 26 and the emitter currents of the transistors 2.14 and 2.13 are coupled to the outputs 27 and 28 respectively, of the precision current-mirror circuit 25. The sum of the emitter currents of transistors 2.17, 2.16 and 2.15 is accurately equal to 4 Io. Then the accurately reflected currents 4 Io and 8 Io appear at the outputs 27 and 28. These accurate currents are again compared with the inaccurate emitter currents 4 Io and 8 Io of the transistors 2.14 and 2.13. Differences in current value are again converted into logic signals by the detection circuits 81 and 82, which logic signals are applied to the inputs 14.54 and 14.53 of the counting circuits 14.14 and 14.13. The analog output voltages of the D/A converters 14.34 and 14.33 are applied to the gate electrodes 13.14 and 13.13 of the transistors 12.14 and 12.13. In the same way the sum of the corrected currents constitutes the input current to the current mirror 25 in the next intervals. When all currents have been corrected, the cycle recommences.

In the same way as in the first embodiment, it is not necessary to correct all currents in the second embodiment. By means of the reference transistor, it is possible to generate a current which is equal to a current which is larger than the current corresponding to the least significant bit. Only currents larger than and equal to this reference current are then corrected.

Figure 3:
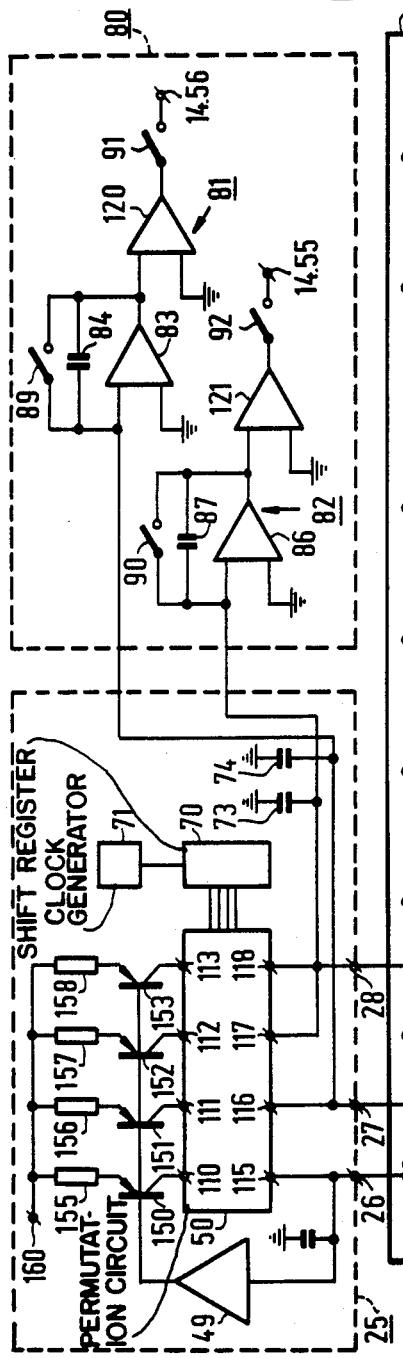
FIG. 3 shows a third embodiment of the invention in the form of a digital-analog converter.
Figure 3:
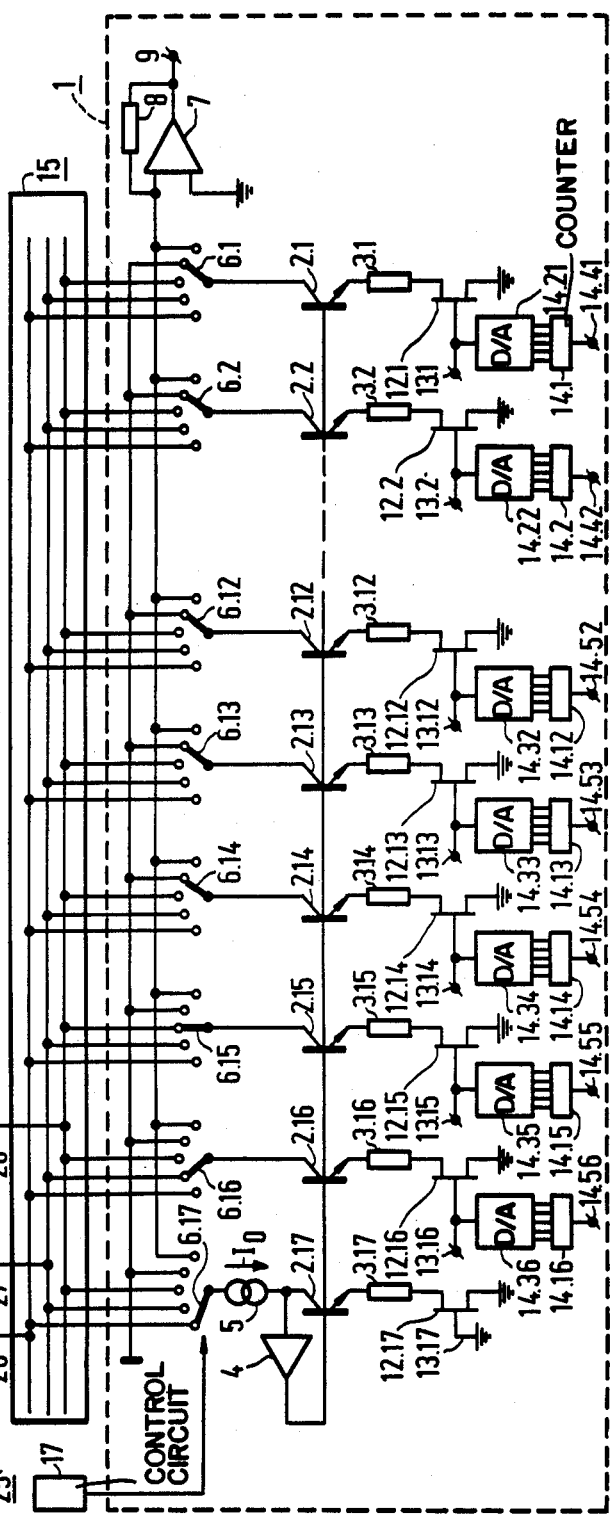

A third embodiment will be described with reference to FIG. 3, in which identical parts bear the same reference numerals as in FIG. 2. The D/A converter 1 again comprises 16 transistors 2.1 to 2.16 with untrimmed binary weighted resistors 3.1 to 3.16 and a reference transistors 2.17 with a resistor 3.17. The commoned bases are driven by the amplifier 4 so that the collector current of transistor 2.17 is Io. The emitter resistors 3.1 to 3.17 are connected to ground by means of the field-effect transistors 12.1 to 12.17. Again correction circuits with inputs 14.41 to 14.56 are coupled to the gate electrodes 13.1 to 13.16. The switches 6.1 to 6.16, which are controlled by the digital input code, again feed the currents either to earth or to the input of the amplifier 7. However, the switches 6.1 to 6.17 may also be coupled to the input 26 and the outputs 27 and 28 of the precision current-mirror circuit 25 by the control circuit 17, which input and outputs in the present embodiment are not coupled to the emitter lines but to the collector lines of the transistors 2.1 to 2.17. When the precision current-mirror arrangement 25 is coupled to these lines the operation of the D/A converter 1 is interrupted. In the present embodiment, the current-mirror circuit 25 comprises parallel-connected PNP-transistors 150 to 153 instead of NPN-transistors as in FIG. 2. Via equal resistors 155 to 158, the emitters are connected to a common terminal 160, which is the positive power-supply terminal. The commoned bases of the transistors 150 to 153 are coupled to the output of the amplifier 49, whose input is coupled to the input 26 of the current-mirror circuit 25. The amplifier 49 controls the voltage on the commoned bases in such a way that the current on the output 115 is equal to the current on the input 26. The permutation circuit 50 transfers the currents on the inputs 110 to 113 to the outputs 115 to 118 in accordance with a cyclic permutation, so that the currents on the input 26 and the outputs 27 and 28 are accurately proportioned as 1:1:2. Again the ripple is filtered out by the capacitors 72, 73 and 74. In the first interval of the cycle of the control circuit 17, as shown, the current on input 26 is Io. The reflected currents on the outputs 27 and 28 are then accurately equal to Io and 2 Io. The differences between these accurately reflected currents and the inaccurate collector currents of the transistors 2.16 and 2.15 which are coupled to the outputs 27 and 28 are again detected by the detection circuits 81 and 82. The outputs of these circuits 81 and 82 are coupled to the inputs 14.56 and 14.55 of the correction circuits, by means of which the collector currents of the transistors 2.16 and 2.15 are corrected. In the next interval of the cycle of the control circuit 18 the collector currents of the transistors 2.17, 2.16 and 2.15 are together coupled to the input 26 and the collector currents of the transistors 2.14 and 2.13 are coupled to the outputs 27 and 28, respectively, so that the collector currents of the transistors 2.14 and 2.13 are rendered accurately equal to 4 Io and 8 Io. In the same way, the sum of the corrected currents constitutes the input current for the current mirror 25 in the next intervals. After the collector currents of the transistors 2.1 to 2.16 have been corrected in a number of cycles, the current-mirror circuit 25 may be coupled periodically to the D/A converter 1 in order to correct the collector currents again. The frequency with which this is effected inter alia depends on the variation of the collector currents as a function of time. In the same way as in the first and the second embodiment, it is not necessary in the present embodiment to correct all the currents, but the reference current may be larger than the current corresponding to the least significant bit. In the third embodiment, the resistors 3.1 to 3.17 may alternatively be connected directly to ground without the inclusion of the field-effect transistors 12.1 to 12.16. In that case, the correction D/A converters 14.21 to 14.36 must be provided with a current output instead of a voltage output, which outputs must then be connected to the emitters of the transistors 2.1 to 2.16. By the addition of a correction current, the voltage across the relevant resistor 3.1 to 3.16 is increased or reduced, which results in a decrease or increase of the collector current of the relevant transistor 2.1 to 2.16. If this third embodiment is equipped with hold capacitors, as in FIG. 1, instead of correction D/A-converters, the outputs of the correction circuits 18.2 to 18.16 may be connected directly to the resistors 3.1 to 3.16 without the inclusion of the field-effect transistors 12.1 to 12.17.

In the embodiments so far described, the precision current-mirror circuit 25 always comprises one input and two outputs. This has the advantage that two currents are corrected per interval of the cycle of the control circuit so that all currents can be corrected in a comparatively short time. However, instead of two outputs, the precision current-mirror 25 may comprise only one output.

Moreover, in the embodiment so far described, the number of outputs of the permutation circuit 50 is always equal to the number of inputs of the permutation circuit 50. Moreover, the ratio between the currents on the outputs of the permutation circuit 50 is always substantially equal to unity. Current-mirror ratios different from unity are obtained by combining currents on the outputs of the permutation circuit 50. In a precision current-mirror circuit in accordance with the invention, the number of outputs of the permutation circuit 50 may differ from the number of inputs, the number of currents transferred to an output in one period of the cycle time of the permutation circuit may be different from one, and the number of currents flowing to each output in one period of the cycle time may be different. Furthermore, the transistors of the current-mirror circuit may be selectively activated.

Figure 4:
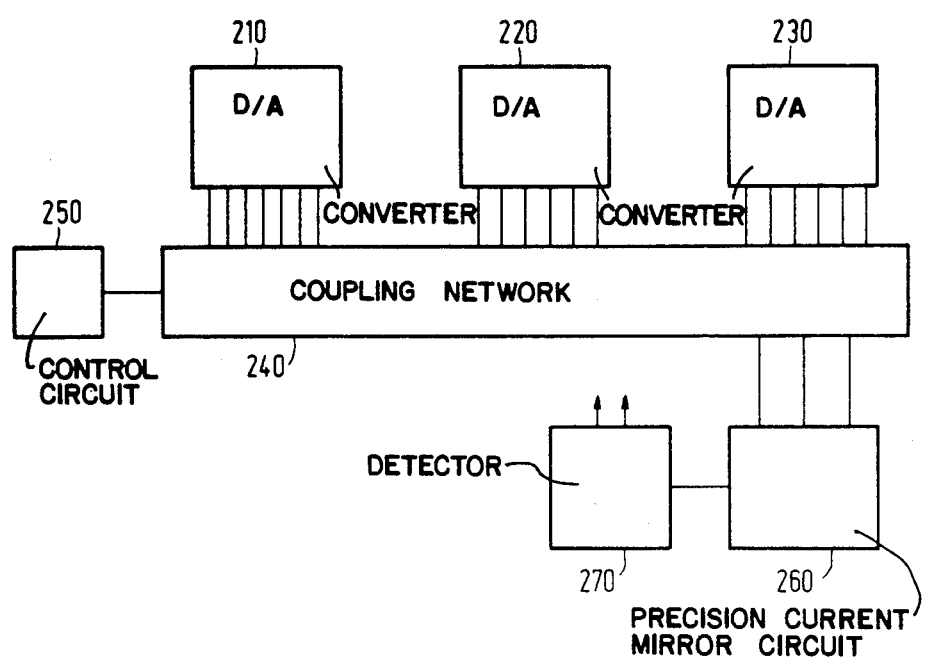
FIG. 4 shows a fourth embodiment of the invention in the form of a digital-to-analog converter.

A fourth embodiment is described with reference to FIG. 4, which schematically shows three 16-bit D/A converters 210, 220 and 230, which are for example identical to the D/A converter 1 shown in FIG. 2. By means of a coupling network 240, which is controlled by a control circuit 250, the currents from the D/A converters 210, 220 and 230 can be corrected using only one precision current-mirror circuit 260, which is for example constituted by a 1:1:2 current-mirror circuit as shown in FIG. 2, and detection circuits 270. The current-mirror circuit 260 can correct the D/A-converters 210, 220 and 230 with a low frequency, because the variation of the currents from the D/A converters 210, 220 and 230 in one cycle time of the control circuit 260 is small.

Figure 5:
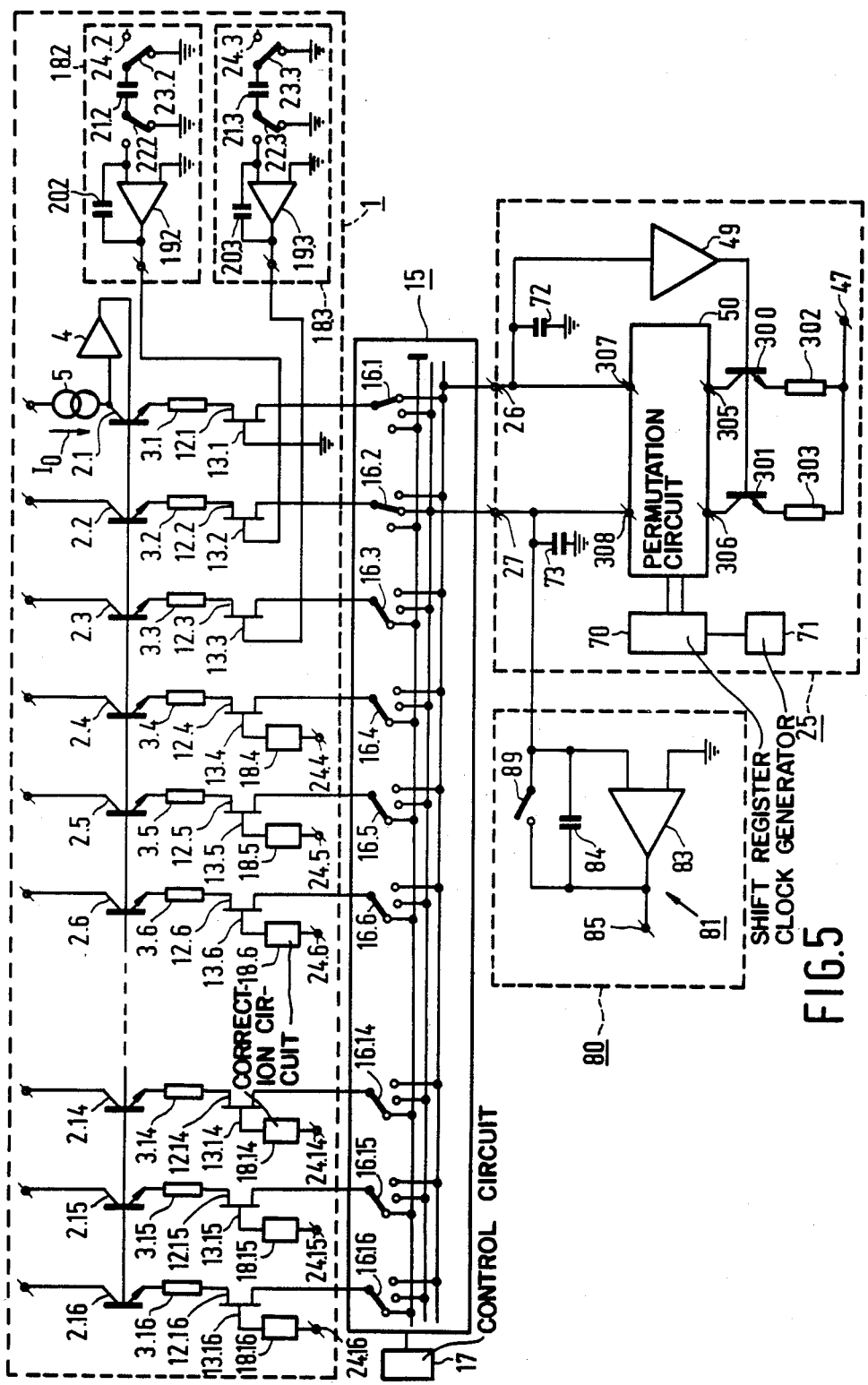
FIG. 5 shows a fifth embodiment of the invention used as a current-source arrangement.

So far the invention has been described for use in conjunction with D/A-converters. However, the invention is not limited to D/A-converters but may be used in any circuit arrangement in which a plurality of currents with an accurate mutual ratio are required. An embodiment for obtaining a large number of equal currents is described with reference to FIG. 5 in which identical pairs bear the same reference numerals as in FIG. 1. The section 1 is constructed in the same way as in FIG. 1, except that the emitter areas of the transistors 2.1 to 2.16 and the emitter resistors 3.1 to 3.16 are not binary scaled but are substantially equal to each other. Moreover, the collector lines are not coupled to the input of a summation amplifier but are coupled to further circuits, not shown, included in the integrated circuit. The emitter currents of the transistors 2.1 to 2.16 may be coupled to the input 26 and, in the present case, the one output 27 of the current-mirror circuit 25 by means of the coupling network 15. In the consecutive intervals the control circuit 17 controls the switches 16.1 to 16.16 in such a way that one emitter current is compared each time with the reference emitter current of the transistor 2.1. The current-mirror circuit 25 comprises two transistors 300 and 301 with emitter resistors 302 and 303. Their commoned bases are again driven by an amplifier 49 whose input is connected to the input 26. The currents on the inputs 305 and 306 are transferred to the outputs 307 and 308 by the permutation circuit 50 in accordance with a cyclic permutation, so that accurately equal currents appear on the input 26 and the output 27. The difference between an accurately reflected current and the inaccurate emitter current of transistor 2.2 is detected by the detection circuit 81, by means of which the capacitor 20.2 is charged so that the emitter current is corrected. In the next intervals each of the currents from the transistors 2.3 to 2.16 is compared with the reference current from transistor 2.1 and is corrected.

It will be evident that a multitude of variants to the embodiments shown are possible within the scope of the invention. For example, it is obvious that in the embodiments shown, P-MOS-transistors may be used instead of the P-channel junction field-effect transistors 12.1 to 12.17 and N-channel junction FETs and N-MOS-transistors may be used instead of the NPN-transistors 2.1 to 2.16. Moreover, it is obvious that complementary PNP-transistors, P-channel junction FETs and P-MOS transistors may be used for the transistors 2.1 to 2.16 and N-channel junction FETs and N-MOS transistors for the transistors 12.1 to 12.17. The same applies to the other transistors in the circuit. For example, in the embodiments, it is possible to employ field-effect transistors as the current source transistors and to employ bipolar transistors to control the currents from the current-source transistors. Also a large number of modifications to the detection and correction circuits are conceivable to those skilled in the art.

What is claimed is:

1. A current-source arrangement comprising:
   means for generating a plurality of output currents which are substantially in a given current ratio,
   means coupled to said generating means for detecting deviations in the values of at least some of the output currents from those required to realize the given current ratio, and
   means coupled to said generating means for correcting said output currents so as to reduce the detected deviations applied thereto, characterized in that the means for detecting deviations in the values of the currents comprises:
   a precision current-mirror circuit having an input and at least one output on which a current appears whose value is in an accurate ratio to a current on the input,
   a coupling network for cyclically coupling at least some of the output currents from the means for generating a plurality of output currents to the input and at least one output of the precision current-mirror circuit, and
   a detection circuit on each output of the precision current-mirror circuit for detecting the difference between the output current from the means for generating a plurality of output currents coupled to said output and the current from the current-mirror circuit which also appears on said output.

2. A current-source arrangement as claimed in claim 1, characterized in that the precision current-mirror circuit comprises:
   a current distribution circuit provided with a plurality of transistors having parallel-connected main current paths and having commoned control electrodes, an amplifier coupled to the input of the current-mirror circuit for driving said commoned control electrodes, and
   a permutation circuit coupled to the main current paths of said plurality of transistors for transferring the currents from the current distribution circuit to the input and at least one output of the current-mirror circuit in accordance with a cyclic permutation.

3. A current-source arrangement as claimed in claim 1 or 2, characterized in that each detection circuit comprises a first current-voltage converter.

4. A current-source arrangement as claimed in claim 3, characterized in that each first current-voltage converter comprises an amplifier having a first input which is coupled to the corresponding output of the current-mirror circuit, a second input which carries a reference voltage, and an output which is coupled to the first input of the amplifier via a feedback capacitor.

5. A current-source arrangement as claimed in claim 4, characterized in that each first current-voltage converter further comprises a comparator, the amplifier output being coupled to a first input of the comparator and a reference voltage being coupled to a second input of the comparator.

6. A current-source arrangement as claimed in claim 3, characterized in that the means for correcting the output currents comprise a second current-voltage converter corresponding to each output current to be corrected, which second current-voltage converter comprises an amplifier having an output which is coupled to a first input of the amplifier via a feedback capacitor, which first input is selectively coupled to the output of the first current-voltage converter through a switching capacitor.

7. A current-source arrangement as claimed in claim 5, characterized in that the means for correcting output currents comprises a counting circuit corresponding to each output current to be corrected, which counting circuit is selectively coupled to the output of the current-voltage converter by means of a switch and generates a plurality of logic signals in dependence upon the logic signal on the output of the comparator, and a digital-to-analog converter coupled to said counting circuit for converting the logic signals to an analog output signal with which the relevant output current is corrected.

8. A current source arrangement as claimed in claim 1, characterized in that the values of said plurality of output currents vary in accordance with a binary weighted series.

9. A current source arrangement as claimed in claim 1, characterized in that said plurality of output currents are of substantially equal values.

10. A current source arrangement as claimed in claim 1, wherein the means for generating a plurality of output currents comprises a plurality of parallel branches which each comprise the main current path of a respective first transistor, which main current path extends between respective first and second main terminals, and a resistor which is coupled in series with the main current path of the relevant first transistor, characterized in that at least one output and the input of the precision current-mirror circuit are coupled to said parallel branches by the coupling network.

11. A current source arrangement as claimed in claim 10, characterized in that in at least some of the parallel branches at those ends of the resistors which are remote from the first transistors a main current path of a field-effect transistor is arranged, which path extends between respective first and second main terminals.

12. A current source arrangement as claimed in claim 11, characterized in that at least one output and the input of the precision current-mirror circuit are coupled to the second main terminals of the field-effect transistors by the coupling network.

13. A current source arrangement as claimed in claim 11 or 12, characterized in that the outputs of the correction means are coupled to the gate electrodes of the field-effect transistors.

* * * * *